United States Patent
Ohnishi et al.

(10) Patent No.: US 6,403,236 B1
(45) Date of Patent: Jun. 11, 2002

(54) POLYMER LIGHT EMITTING DEVICE

(75) Inventors: Toshihiro Ohnishi; Takanobu Noguchi; Shuji Doi, all of Ibaraki (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/145,338

(22) Filed: Sep. 1, 1998

(30) Foreign Application Priority Data

Sep. 4, 1997 (JP) .............................................. 9-239625

(51) Int. Cl.$^7$ ........................ H05B 33/00; C08G 61/02; C09K 11/06
(52) U.S. Cl. ........................ 428/690; 428/212; 428/917; 313/504; 313/506; 257/94
(58) Field of Search ................................ 428/690, 917, 428/212; 313/504, 506; 257/94

(56) References Cited

U.S. PATENT DOCUMENTS

| | | | | |
|---|---|---|---|---|
| 5,317,169 A | * | 5/1994 | Nakano et al. | 257/40 |
| 5,543,079 A | * | 8/1996 | Ohnishi et al. | 252/301.35 |
| 5,589,320 A | * | 12/1996 | Ohnishi et al. | 430/321 |
| 5,726,457 A | * | 3/1998 | Nakano et al. | 257/40 |
| 5,759,709 A | * | 6/1998 | Doi et al. | 428/690 |
| 5,821,002 A | * | 10/1998 | Ohnishi et al. | 428/690 |
| 5,858,563 A | * | 1/1999 | Sano et al. | 428/690 |
| 5,972,247 A | * | 10/1999 | Shi et al. | 252/583 |
| 5,980,781 A | * | 11/1999 | Doi et al. | 252/301.16 |

FOREIGN PATENT DOCUMENTS

| | | |
|---|---|---|
| DE | 195 05 416 | 8/1996 |
| EP | 0 443 862 | 8/1991 |
| EP | 0 728 828 | 8/1996 |
| WO | 94/06157 | 3/1994 |
| WO | 95/01871 | 1/1995 |

OTHER PUBLICATIONS

European Search Report.
Database WPI XP002185715 (JP 05 202355 A), Derwent Publications Ltd., Aug. 10, 1993.
Databse WPI XP002185716 (JP 09 045478 A), Derwent Publications Ltd., Feb. 14, 1997.

* cited by examiner

Primary Examiner—Cynthia H. Kelly
Assistant Examiner—Dawn Garrett
(74) Attorney, Agent, or Firm—Sughrue Mion, PLLC

(57) ABSTRACT

A polymer light emitting device at least having a light emitting layer containing a polymeric fluorescent substance and a charge transporting layer, wherein said polymeric fluorescent substance contains one or more kind of repeating units represented by the following formula (1), $$-Ar_1-CR_1=CR_2- \quad (1)$$

and said charge transporting layer contains an organic compound satisfying the following conditions 1 and 2 in an amount of from 1 to 70% by weight $$E_{OX2}-0.15 \leq E_{OX1} \leq E_{OX2}+0.10 \quad \text{(condition 1)}$$

$$\lambda_{edge2}-30 \leq \lambda_{edge1} \leq \lambda_{edge2}+20 \quad \text{(condition 2)}$$

(wherein $E_{OX1}$ and $\lambda_{edge1}$ respectively represent an electrochemically determined oxidation potential and an absorption edge wavelength of an absorption spectrum of said organic compound; $E_{OX2}$ and $\lambda_{edge2}$ respectively represent an electrochemically determined oxidation potential and an absorption edge wavelength of an absorption spectrum of said polymeric fluorescent substance used in said light emitting layer; and the unit in the condition 1 is V and the unit in the condition 2 is nm). The polymer light emitting device has a long and excellent stability on driving.

7 Claims, No Drawings

POLYMER LIGHT EMITTING DEVICE

BACKGROUND OF THE INVENTION

FIELD OF THE INVENTION

The present invention relates to a polymer light emitting device (hereinafter referred to as an "polymer LED").

An inorganic electroluminescence device using an inorganic fluorescent substance as a light emitting material (which may hereinafter referred to as an "inorganic EL device") has been used, for example, as a flat light source for back light or a display device such as a flat panel display and the like, however, high A.C. voltage has been required to emit light.

Recently, Tang et al. manufactured an organic electroluminescence device (hereinafter referred to as an "organic EL device") having a double-layer structure, comprising a laminate of a light emitting layer made of an organic fluorescent dye and a layer of an organic charge transporting compound generally used, for example, as a photosensitive material for electrophotography (JP-A-59-194393). Since the organic EL device has a feature that emission of light of various colors can be easily obtained, in addition to low-voltage driving and high luminance, in comparison with the inorganic EL device, various attempts for device structure, organic fluorescent dye and organic charge transporting compound have been reported (Jpn. J. Appl. Phys., Vol. 27, page L269 (1988); and J. Appl. Phys., Vol. 65, page 3610 (1989)).

The polymer LED using a polymeric light emitting material, other than the organic EL device mainly using low-molecular weight organic compounds, has been proposed in WO9013148, JP-A-3-244630, Appl. Phys. Lett. Vol.58, page 1982 (1991) and the like. In the Examples of WO9013148, there is disclosed that a poly(p-phenylenevinylene) thin film converted into a conjugated polymer is obtained by forming a film of a soluble precursor on an electrode and then subjecting it to a heat treatment, and a device using the same.

Furthermore, JP-A-3-244630 discloses conjugated polymers having a feature that the conjugated polymers themselves are soluble in solvents and require no heat treatment. Also, in Appl. Phys. Lett. Vol.58, page 1982 (1991), there are described polymeric light emitting materials, which are soluble in solvents, and polymeric LEDs made by using the same.

JP-A-3-273087 discloses a polymer LED formed by laminating a light emitting layer of a polymeric light emitting material and a hole transporting layer of a conjugated polymer. In case of a polymer LED, a device having high light emitting efficiency can also be obtained by providing a laminated structure. However, there has been required an organic EL device having a sufficient long-term stability, wherein a decrease in luminance and an increase in voltage on driving are smaller than those of these devices.

A method of elongating the lifetime of a light emitting device is proposed, for example, in WO94/06157, JP-A-8-231951 and the like, particularly with respect to an organic EL device made by deposition of a low-molecular-weight material. WO94/06157 discloses that, when a small amount of distyrylalylene derivative is added to a light emitting layer or a hole transporting layer, it functions as an charge injection assistant, and the lifetime of the device is elongated. JP-A-8-231951 discloses that a device having a elongated lifetime can be obtained by using a light emitting layer made by adding a condensed polycyclic aromatic compound to a diamine derivative.

On the other hand, regarding the polymer LED, since an organic layer can be easily formed by coating, it is advantageous to increase the area and to reduce the cost compared with the case where a low-molecular-weight material is deposited. It is considered that the mechanical strength of the film is also excellent by virtue of polymer, but elongation of the lifetime is unsatisfactory. That is, an improvement in stability on driving is required in the polymer LED.

SUMMARY OF THE INVENTION

An object of the present invention is to provide a long-life polymer light emitting device having excellent stability on driving.

Under these circumstances, the present inventors have intensively studied. As a result, the present inventors have found that a long-life polymer light emitting device having excellent stability can be obtained without deteriorating the feature such as luminance, light emitting efficiency and the like, by adding a specific organic compound to a charge transporting layer. Thus, the present invention has been accomplished.

That is, the present invention relates to a polymer light emitting device at least having a light emitting layer containing a polymeric fluorescent substance and a charge transporting layer provided adjacent to the light emitting layer between electrodes consisting of a pair of an anode and a cathode, at least one of which electrode is transparent or semitransparent, wherein said polymeric fluorescent substance contains one or more kind of repeating units represented by the following formula (1), the sum of the repeating units being not less than 50% by mol based on the total repeating units, and has a number-average molecular weight of $10^3$ to $10^7$ in terms of polystyrene $$—Ar_1—CR_1=CR_2— \quad (1)$$

(wherein $Ar_1$ represents an arylene group having 4 to 20 carbon atoms taking part in a conjugated bond, or a heterocyclic compound group having 4 to 20 carbon atoms taking part in a conjugated bond; and $R_1$ and $R_2$ independently represent a group selected from the group consisting of hydrogen, an alkyl group having 1 to 20 carbon atoms, an aryl group having 6 to 20 carbon atoms, a heterocyclic compound group having 4 to 20 carbon atoms and a cyano group), and said charge transporting layer contains an organic compound satisfying the following conditions 1 and 2 in an amount of from 1 to 70% by weight

| | |
|---|---|
| $E_{OX2}-0.15 \leq E_{OX1} \leq E_{OX2}+0.10$ | (condition 1) |
| $\lambda_{edge2}-30 \leq \lambda_{edge1} \leq \lambda_{edge2}+20$ | (condition 2) |

(wherein $E_{OX1}$ and $\lambda_{edge1}$ respectively represent an electrochemically determined oxidation potential and an absorption edge wavelength of an absorption spectrum of said organic compound; $E_{OX2}$ and $\lambda_{edge2}$ respectively represent an electrochemically determined oxidation potential and an absorption edge wavelength of an absorption spectrum of said polymeric fluorescent substance used in said light emitting layer; and the unit in the condition 1 is V and the unit in the condition 2 is nm).

DETAILED DESCRIPTION OF THE INVENTION

As the structure of the polymer LED of the present invention, a light emitting layer containing a polymeric fluorescent substance and a charge transporting layer containing the organic compound (A) are laminated.

For example, the structures of the following (a) to (e) are shown.

(a) Anode/Hole transporting layer (Organic compound(A))/ Light emitting layer/Cathode
(b) Anode/Hole transporting layer (Organic compound (A))/ Light emitting layer/Electron transporting layer/Cathode
(c) Anode/Light emitting layer/Electron transporting layer (Organic compound (A))/Cathode
(d) Anode/Hole transporting layer/Light emitting layer/ Electron transporting layer (Organic compound(A))/ Cathode
(e) Anode/Hole transporting layer (Organic compound(A))/ Light emitting layer/Electron transporting layer (Organic compound(A))/Cathode In the above, the symbol "/" represents lamination, and "(Organic compound(A))" represents that the organic compound(A) is contained in the layer.

Two or more light emitting layers, hole transporting layers and electron transporting layers may be independently used and, furthermore, a buffer layer may be inserted into any of interfaces in order to improve the adhesion and prevent the interface from the mixing. The order and number of layers to be laminated and the thickness of each layer are not specifically limited, but can be appropriately used considering the light emitting efficiency and the lifetime of the device.

Furthermore, the present invention also includes the case where the organic compound (A) is contained in the charge transporting layer and, at the same time, contained in the light emitting layer in the above structure.

In the polymer LED of the present invention, the organic compound (A) added in the charge transporting layer will be described hereinafter. The organic compound (A) may be any one which satisfy the conditions 1 and 2. When the values of the electrochemically determined oxidation potentials of the organic compound (A) and a polymeric fluorescent substance used as a light emitting layer ($E_{OX1}$ and $E_{OX2}$ respectively) and the absorption edge wavelengths of the absorption spectrum ($\lambda_{edge1}$ and $\lambda_{edge2}$ respectively) are respectively very close each other, the conditions 1 and 2 are satisfied. That is, it is the case that where the difference between $E_{OX1}$ and $E_{OX2}$ is from −0.15 to +0.10V and the difference between $\lambda_{edge1}$ and $\lambda_{edge2}$ is from −30 to +20 nm. When these conditions are satisfied, transfer of charge or energy would become easy between the organic compound (A) and the polymeric light emitting substance used in the light emitting layer.

As a specific method of determining the difference of the oxidation potential, the following electrochemical method can be used. That is, the cyclic voltammetry of the organic compound (A) and that of the polymeric fluorescent substance are conducted and potentials (oxidation potentials) at which the oxidation wave rise from the baseline are obtained to take the difference. Specifically, for example, first, a thin film is formed on a platinum electrode by dipping from a solution of the material to be measured. Then, cyclic voltammetry is conducted in an organic solvent containing a suitable supporting electrolyte, for example, in an acetonitrile solution of 0.1 N tetrabutylammonium tetrafluoroborate, using a platinum electrode coated with the material as a working electrode, using another uncoated platinum electrode as a counter electrode and using, for example, a silver/silver chloride electrode, a saturated calomel electrode, standard hydrogen electrode and the like as a reference electrode. When the material to be measured is easily dissolved in the solvent used as an electrolysis solution, the measurement may be conducted by dissolving this material in the electrolysis solution instead of coating the electrode. The concentration may be selected so that the oxidation wave can be easily detected.

At that time, various conditions such as sweep rate and sweep region of the potential are fixed during the measurement of any materials, for example, 50 mV/second as the sweep rate and −200 to 1200 mV (potential vs. silver/silver chloride electrode) as the sweep region are specified. For the resulting cyclic voltammogram, the potential of the intersecting point of the tangent line to the baseline and the tangent line to the rising portion of the oxidation wave may be determined with each material to take the difference.

On the other hand, to determine the difference between the absorption edge wavelengths of the absorption spectrum, the absorption spectra are measured and the wavelengths at which the absorption rises from the baseline are obtained to take the difference. Specifically, a thin film having a thickness of approximately 50 to 300 nm is formed on a quartz substrate by spin-coating from a solution of the material to be measured, thereby to obtain the absorption spectrum. For this spectrum, the wavelength of the intersecting point of the tangent line to the baseline and the tangent line to the rising portion of the absorption spectrum is regarded as the absorption edge wavelength. This may be determined with each material to take the difference.

The organic compound (A) is appropriately selected so as to satisfy the conditions 1 and 2 depending on the combination with the polymeric fluorescent substance used as a light emitting layer. The organic compound is, for example, an oligomer having repeating units, which are similar to or the same as those of the polymeric fluorescent substance used in a light emitting layer, and a low-molecular-weight compound having a condensed polycyclic aromatic compound group conjugated to similar or the same structure to the repeating unit and the like. In this case, it is preferable that the condensed polycyclic aromatic compound group contains three or more rings.

Particularly, in the case of having a structure of the repeating unit composed of the same skeleton as that of the polymeric fluorescent substance used in a light emitting layer in the molecule, that is, in the case of having one or more kinds of repeating units of a polymeric fluorescent substance used in a light emitting layer in a part of constituting units of the organic compound, it is likely to become similar energy state, so it is preferable. The polymeric fluorescent substance itself used in the light emitting layer also satisfies the conditions 1 and 2, but when the charge transporting layer is composed of a polymeric material, it is difficult to mix uniformly and phase separation arises sometimes. On the other hand, when the molecular weight of the organic compound (A) is very small, if the large amount of it is added, the film quality and film strength of the charge transporting layer are likely to becomes insufficient. Depending on the structure of the charge transporting material and the organic compound (A), the molecular weight of the organic compound (A) is preferably not more than $10^4$ and not less than $5 \times 10^2$, and more preferably not more than $4 \times 10^3$ and not less than $10^3$, in order to uniformly disperse into the charge transporting layer. For example, an oligomer containing from 3 to 7 of the repeating units represented by the above formula (1) on the average has a suitable molecular weight and, therefore, it can be preferably used.

Specific examples of the organic compound (A) include the compounds represented by the following formulas (2), (5) and (6). These organic compounds (A) may be used alone or in combination thereof. The content of the organic compound in the charge transporting layer is from 1 to 70% by weight based on the whole material contained in the layer. To obtain the sufficient effect, the larger the amount, the better. To maintain the film quality, the smaller the amount, the better. Therefore, the content of the organic compound in the charge transporting layer is preferably from 4 to 70% by weight, more preferably from 9 to 50% by weight, and particularly from 15 to 40% by weight.

A method of mixing the organic compound (A) in the charge transporting layer is not specifically limited, but is appropriately decided depending on the charge transporting layer to be used. For example, when the charge transporting material is a low-molecular-weight material, a co-deposition method is used as a vacuum depositing method and a method of mixing in a solution is used as a method of forming a film from a mixed solution with a polymeric binder. When the charge transporting material is a polymer, since film formation from a solution is general, a method of mixing to a solution is used.

$$Ar_2-CR_3=CR_4-(B)_n-Ar_3-CR_5=CR_6-Ar_4 \tag{2}$$

In the formula, B is a divalent compound group represented by the following formula (3) or (4), a group obtained by combining one or more groups represented by (3), a group obtained by combining one or more groups represented by (4), or a group obtained by combining one or more groups represented by (3) with one or more groups represented by (4)

$$-Ar_5-CR_7=CR_8- \tag{3}$$

$$-Ar_6-CR_9=CR_{10}-Ar_7-CR_{11}=CR_{12} \tag{4}$$

wherein $Ar_3$, $Ar_5$, $Ar_6$ and $Ar_7$ independently represent an arylene group having 4 to 20 carbon atoms taking part in a conjugated bond, or a heterocylic compound group having 4 to 20 carbon atoms taking part in a conjugated bond, but $Ar_6$ and $Ar_7$ are not the same; n is an integer of 0 to 10. In the case that B is represented by the formula (3), n is more preferably an integer of 2 to 6, and when B is represented by the formula (4), n is more preferably an integer of 1 to 3; $Ar_2$ and $Ar_4$ independently represent a condensed polycyclic aromatic compound group having 3 to 10 rings, or when n is 4 to 10, $Ar_2$ and $Ar_4$ independently represent an aryl group having 4 to 20 carbon atoms taking part in a conjugated bond, or a heterocylic compound group having 4 to 20 carbon atoms taking part in a conjugated bond; and $R_3$, $R_4$, $R_5$, $R_6$, $R_7$, $R_8$, $R_9$, $R_{10}$, $R_{11}$ and $R_{12}$ independently represent a group selected from the group consisting of hydrogen, an alkyl group having 1 to 20 carbon atoms, an aryl group having 6 to 20 carbon atoms, a heterocyclic compound group having 4 to 20 carbon atoms and a cyano group.

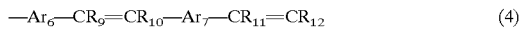

(5)

wherein $Ar_{12}$ represents a tetravalent aryl group having 4 to 20 carbon atoms taking part in a conjugated bond, or a heterocylic compound group having 4 to 20 carbon atoms taking part in a conjugated bond; $Ar_8$ to $Ar_{11}$ independently is selected from a condensed polycyclic aromatic compound group having 3 to 10 rings; $R_{13}$ to $R_{20}$ independently represent a group selected from the group consisting of hydrogen, an alkyl group having 1 to 20 carbon atoms, an aryl group having 6 to 20 carbon atoms, a heterocyclic compound group having 4 to 20 carbon atoms and a cyano group.

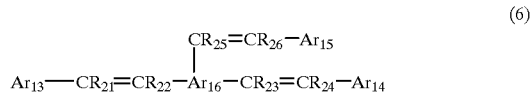

(6)

wherein $Ar_{16}$ represents a trivalent aryl group having 4 to 20 carbon atoms taking part in a conjugated bond, or a heterocylic compound group having 4 to 20 carbon atoms taking part in a conjugated bond; $Ar_{13}$ to $Ar_{15}$ independently is selected from a condensed polycyclic aromatic compound group having 3 to 10 rings; and $R_{21}$ to $R_{26}$ independently represent a group selected from the group consisting of hydrogen, an alkyl group having 1 to 20 carbon atoms, an aryl group having 6 to 20 carbon atoms, a heterocyclic compound group having 4 to 20 carbon atoms and a cyano group.

Specific examples of $Ar_3$, $Ar_5$, $Ar_6$ and $Ar_7$ include a divalent group or a derivative thereof containing benzene, pyridine, pyradine, pyrimidine, pyridazine, naphtalene, anthracene, thiophene, fluorene, furane, quinoline, quinoxaline, pyrene, peryrene, phenanthrene, etc. or a divalent group combining thereof. Among them, benzene, naphtalene, anthracene, fluorene and pyrene are preferable.

Specific examples of $Ar_{12}$ include a tetravalent group or a derivative thereof containing benzene, pyridine, pyradine, pyrimidine, pyridazine, naphtalene, anthracene, thiophene, fluorene, furane, quinoline, quinoxaline, pyrene, peryrene, phenanthrene, etc. or a tetravalent group combining thereof. Among them, benzene, naphtalene, anthracene, fluorene and pyrene are preferable.

Specific examples of $Ar_{16}$ include a trivalent group or a derivative thereof containing benzene, pyridine, pyradine, pyrimidine, pyridazine, naphtalene, anthracene, thiophene, fluorene, furane, quinoline, quinoxaline, pyrene, peryrene, phenanthrene, etc. or a trivalent group combining thereof. Among them, benzene, naphtalene, anthracene, fluorene and pyrene are preferable.

Specific examples of a condensed polycyclic aromatic compound group represented by $Ar_2$, $Ar_4$, $Ar_8$~$Ar_{11}$ or $Ar_{13}$~$Ar_{15}$ include a divalent group or a derivative thereof containing anthracene, fluorene, pyrene, peryrene, coronene, naphtacene, phenanthrene, and so on. Among them, anthracene, fluorene, pyrene, peryrene and phenanthrene are preferable.

Ring number of condensed polycyclic aromatic compound is defined to be the number of all rings containing the condensed ring. For example, ring number of anthracene is 3, that of fluorene is 3, that of pyrene is 4, that of peryrene is 5, and so on.

In the case that n in the formula (2) is 4 to 10, specific examples of $Ar_2$ or $Ar_4$ include a divalent group or a derivative thereof containing benzene, pyridine, pyradine, pyrimidine, pyridazine, naphtalene, anthracene, thiophene, fluorene, furane, quinoline, quinoxaline, pyrene, peryrene, phenanthrene, etc. or a divalent group combining thereof. Among them, benzene, naphtalene, anthracene, fluorene and pyrene are preferable.

In the case that $R_3$~$R_{26}$ are not hydrogen or a cyano group, the alkyl group having 1 to 20 carbon atoms is exemplified by methyl group, ethyl group, propyl group, butyl group, pentyl group, hexyl group, heptyl group, octyl group, decyl group, lauryl group, etc. Among them, methyl group, ethyl group, pentyl group, hexyl group, heptyl group and octyl group are preferable.

The aryl group having 6 to 20 carbon atoms is exemplified by phenyl group, 4-$C_1$–$C_{12}$ alkoxyphenyl groups ($C_1$–$C_{12}$ refers to 1 to 12 carbon atoms, hereinafter referred to the same), 4-$C_1$–$C_{12}$ alkylphenyl groups, 1-naphtyl group and 2-naphtyl group and so on.

The heterocyclic compound group having 4 to 20 carbon atoms is exemplified by 2-thienyl group, 2-pyrrolyl group, 2-furyl group and 2-, 3- or 4-pyridyl group and so on.

Furthermore, when a uniform dispersion into a charge transporting layer is conducted in a solution state, it is preferable that the organic compound (A) is soluble in a solvent. In this point of view, the organic compound (A) preferably has a group as to enhance the compatibility with the charge transporting material and the solubility to a solvent. Examples of these groups include an alkyl group having 4 to 20 carbon atoms, an alkoxyl group having 4 to 20 carbon atoms, an aryl group having 6 to 20 carbon atoms taking part in a conjugated bond, an aryloxy group having 6 to 20 carbon atoms taking part in a conjugated bond, a heterocyclic compound group having 4 to 20 carbon atoms taking part in a conjugated bond and the like. It is preferable that at least one aryl group or heterocyclic compound group, which has at least one of the above group as a substituent, is contained in a molecule.

These groups are exemplified by the followings. The alkyl group having 4 to 20 carbon atoms includes butyl group, pentyl group, hexyl group, heptyl group, octyl group, decyl group and lauryl group and so on. Among them, pentyl group, hexyl group, heptyl group and octyl group are preferable.

The alkoxyl group having 4 to 20 carbon atoms includes butoxyl group, pentyloxy group, hexyloxy group, heptyloxy group, octyloxy group, decyloxy group, lauryloxy group and phenylpropyloxy group and so on. Among them, pentyloxy group, hexyloxy group, heptyloxy group, octyloxy group and phenylpropyloxy group are preferable.

The aryl group having 4 to 20 carbon atoms includes phenyl group, 4-$C_1$–$C_{12}$ alkoxyphenyl group, 4-$C_1$–$C_{12}$ alkylphenyl group, 1-naphtyl group and 2-naphtyl group and so on.

The aryloxyl group having 4 to 20 carbon atoms is exemplified by phenoxyl group.

The heterocyclic compound group having 4 to 20 carbon atoms includes 2-thienyl group, 2-pyrrolyl group, 2-furyl group, 2-,3- or 4-pyridyl group and so on.

The polymeric fluorescent substance contained in the light emitting layer of the polymer LED of the present invention is poly(arylene vinylene) or its derivative, and is the polymer containing the repeating unit represented by the above formula (1) in an amount of not less than 50% by mol based on the total repeating units. Depending on the structure of the repeating unit, the amount of the repeating unit represented by the formula (1) is preferably not less than 70% by mol based on the total repeating units. The polymeric fluorescent substance may contain a divalent aromatic compound group or its derivative, a divalent heterocyclic compound group or its derivative, or a divalent group combining thereof, etc. as the repeating unit other than the repeating unit represented by the formula (1). The repeating unit represented by the formula (1) and other repeating unit may be combined by a non-conjugated unit having an ether group, an ester group, an amide group, an imide group or the like. Alternatively, the non-conjugated portion may be contained in the repeating unit.

When the light emitting material is a polymeric fluorescent substance containing the repeating unit of the formula (1), $Ar_1$ of the formula (1) includes arylene group having 4 to 20 carbon atoms taking part in the conjugated bond, or heterocyclic compound group having 4 to 20 carbon atoms taking part in the conjugated bond, such as a divalent aromatic compound group or its derivative, a divalent heterocyclic compound group or its derivative, a divalent group combining thereof, or the like, shown in the following formulas (7) to (9).

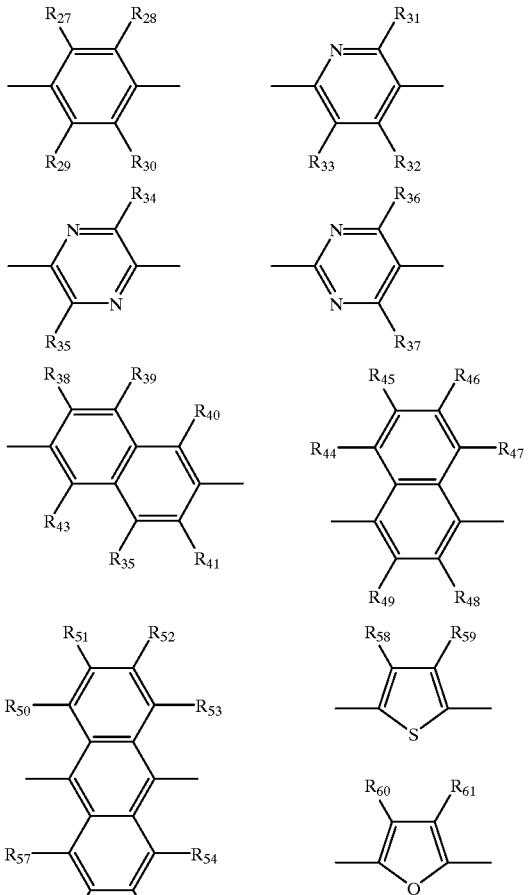

(7)

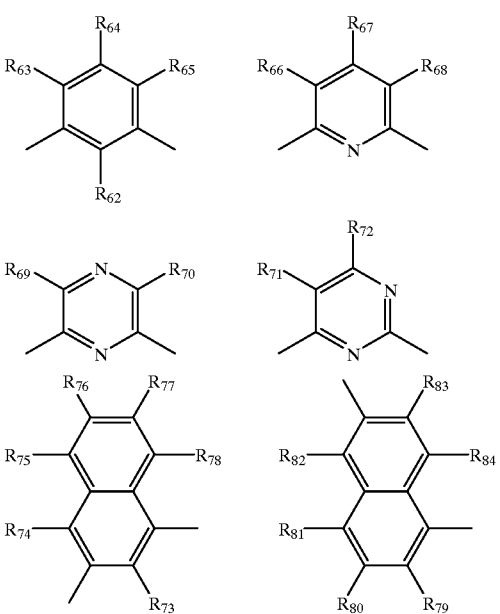

(8)

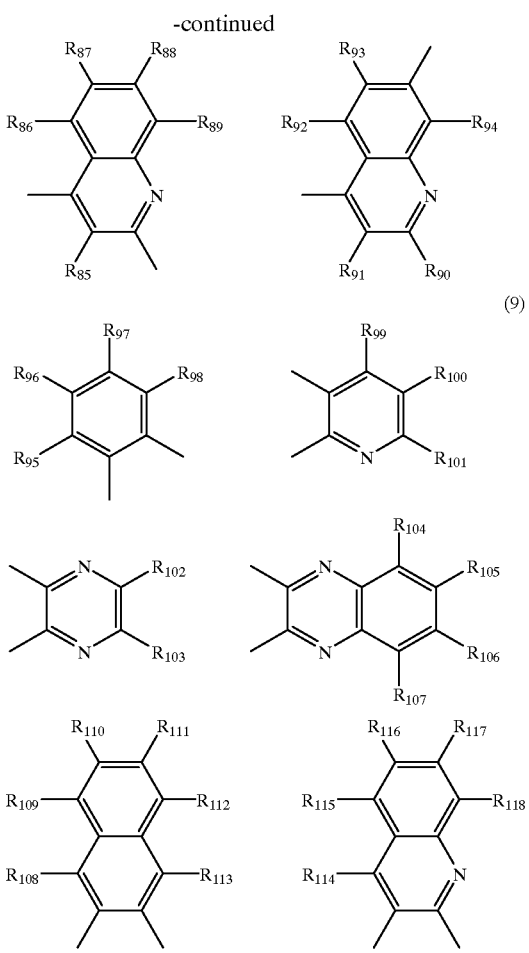

(9)

In the formulas, $R_{27}$~$R_{118}$ are independently a group selected from the group consisting of hydrogen, an alkyl group having 1 to 20 carbon atoms, an alkoxyl group having 1 to 20 carbon atoms, an alkylthio group having 1 to 20 carbon atoms; an aryl group having 6 to 18 carbon atoms, an aryloxyl group having 6 to 18 carbon atoms; a heterocyclic compound group having 4 to 14 carbon atoms.

Among these groups, a phenylene group, a substituted phenylene group, a biphenylene group, a substituted biphenylene group, a naphtalenediyl group, a substituted naphtalenediyl group, a anthracene-9,10-diyl group, a substituted anthracene-9,10-diyl group, a pyridine-2,5-diyl group, a substituted pyridine-2,5-diyl group, a thienylene group and a substituted thienylene group are preferable. More preferable are a phenylene group, a biphenylene group, a naphtalenediyl group, a pyridine-2,5-diyl group and a thienylene group.

In the case that $R_1$ and $R_2$ in the formula (1) are not a hydrogen or a cyano group, they are exemplified as follows.

The alkyl group having 1 to 20 carbon atoms are methyl group, ethyl group, propyl group, butyl group, pentyl group, hexyl group, heptyl group, octyl group, decyl group, lauryl group and so on. Among them, metyl group, ethyl group, pentyl group, hexyl group, heptyl group and octyl group are preferable.

The aryl group having 6 to 20 carbon atoms includes phenyl group, 4-$C_{1-12}$ alkoxyphenyl group, 4-$C_{1-12}$ alkylphenyl group, 1-naphtyl group and 2-naphtyl group and so on. The denotation of $C_{1-12}$ means that 1 to 12 carbon atoms are contained in the alkoxy or alkyl group.

The heterocyclic compound group having 4 to 20 carbon atoms includes 2-thienyl group, 2-pyrrolyl group, 2-furyl group, 2-,3- or 4-pyridyl group and so on.

In view of the solvent solubility, $Ar_1$ of the formula (1) has preferably one or more groups selected from the group consisting of alkyl, alkoxyl or alkylthio group having 4 to 20 carbon atoms, aryl or aryloxyl group having 6 to 20 carbon atoms, and heterocyclic compound group having 4 to 20 carbon atoms.

These substituent groups are exemplified by the followings. The alkyl group having 4 to 20 carbon atoms includes butyl group, pentyl group, hexyl group, heptyl group, octyl group, decyl group and lauryl group and so on. Among them, pentyl group, hexyl group, heptyl group and octyl group are preferable.

The alkoxyl group having 4 to 20 carbon atoms includes butoxyl group, pentyloxy group, hexyloxy group, heptyloxy group, octyloxy group, decyloxy group, lauryloxy group and phenylpropyloxy group and so on. Among them, pentyloxy group, hexyloxy group, heptyloxy group, octyloxy group and phenylpropyloxy group are preferable.

The alkylthio group having 4 to 20 carbon atoms includes butylthio group, pentylthio group, hexylthio group, heptylthio group, octylthio group, decylthio group, laurylthio group and so on. Among them, pentylthio group, hexylthio group, heptylthio group and octylthio group are preferable.

The aryl group having 4 to 20 carbon atoms includes phenyl group, 4-$C_{1-12}$ alkoxyphenyl group, 4-$C_{1-12}$ alkylphenyl group, 1-naphtyl group and 2-naphtyl group and so on.

The aryloxyl group having 4 to 20 carbon atoms is exemplified by phenoxyl group.

The heterocyclic compound group having 4 to 20 carbon atoms includes 2-thienyl group, 2-pyrrolyl group, 2-furyl group, 2-,3- or 4-pyridyl group and so on.

The number of these substituents varies depending on the molecular weight of the polymeric fluorescent substance and construction of the repeating unit. In order to obtain a polymeric fluorescent substance having high solubility, the number of these substituents is preferably at least one per molecular weight of 600.

The terminal group of the polymeric fluorescent substance is not specifically limited, but when the polymerizable group remains entirely, the light emitting properties and the lifetime of the devices are likely to deteriorate, therefore, it is preferably protected with a stable group. Those having a conjugated bond continued to conjugated structure of the main chain are more preferable. Examples thereof include the structure combined with an aryl group or a heterocyclic compound group through a vinylene group.

Specific examples are phenyl group, pyridyl group, naphtyl group, anthryl group, pyrenyl group, perylenyl group, phenynthrenyl group, thienyl group, furyl group, oxadiazolyl group, benzoxazolyl group, fluorenyl group, quinolyl group, quinoxalyl group, and derivative thereof. Among them, phenyl group, 1-naphtyl group, 9-anthryl group, 2-pyridyl group, 2-thienyl group, 1-pyrenyl group, 2-fluorenyl group, 2-quinolyl group and derivative thereof are preferable. More preferable are 1-naphtyl group, 9-anthryl group, 1-pyrenyl group and 2-fluorenyl group.

A synthesizing method of the polymeric fluorescent substance is not specifically limited, and examples thereof include a method described in JP-A-5-202355. That is, examples thereof include polymerization by Witting reaction between a dialdehyde compound and a diphosponium salt compound, polycondensation by dehydrohalogenation method of a compound having two halogenated methyl groups, polycondensation by sulfonium salt decomposition method of a compound having two sulfonium salt groups, polymerization by Knoevenagel reaction between a dialdehyde compound and a diacetonitrile compound and the like.

The polymeric fluorescent substance may be a random, block or graft copolymer, or a polymer having an intermediate structure of them, for example, a partially block type random copolymer. In view of obtaining a polymeric fluorescent substance having high quantum yield of fluorescence, a partially block type random copolymer, and a block or graft copolymer is preferable to a completely random copolymer. The case of having branches in the main chain and containing three or more terminals is also included.

Since light emission from a thin film is utilized, the polymeric fluorescent substance having luminescence in the solid state is preferably used.

Examples of a good solvent for the polymeric fluorescent substance include chloroform, methylene chloride, dichloroethane, tetrahydrofuran, toluene, xylene, mesitylene, decalin, n-butylbenzene and the like. The polymeric fluorescent substance can be usually dissolved in a solvent in an amount of not less than 0.1% by weight, although the amount varies depending on the structure or molecular weight of the polymeric fluorescent substance.

The molecular weight of the polymeric fluorescent substance is preferably within the range from $10^3$ to $10^7$ in terms of polystyrene, and the polymerization degree varies depending on the structure of repeating units and their proportion. In view of the film forming property, the total number of the repeating unit is suitably within the range from 10 to 10000, more suitably from 10 to 3000, and preferably from 20 to 2000.

When these polymeric fluorescent substances are used as the light emitting material of the polymeric LED, since the purity have an influence on light emitting characteristics, the polymeric fluorescent substance is preferably subjected to a purification treatment such as purification by means of reprecipitation, separation by means of chromatography or the like, after synthesis.

On producing the polymeric LED, in the case of film forming from a solution using these polymeric fluorescent substances, which are soluble in an organic solvent, the solvent of this solution is only removed by drying after coating. Also, in the case of mixing a charge transporting material and light emitting material, the same method can be applied, therefore, it is very advantageous on producing. As a method of forming a film forming from a solution, coating methods such as spin coating method, casting method, micro gravure coating method, gravure coating method, bar coating method, roll coating method, wire bar coating method, dipping method, spray coating method, screen printing method, flexographic printing method, offset printing method or the like can be used.

As the light emitting layer, for example, a light emitting material other than the polymeric fluorescent substance may be used in combination.

As the light emitting material, well-known materials can be used. As the low-molecular-weight compound, for example, the light emitting material includes pigments such as naphthalene derivative, anthracene and its derivative, perylene and its derivative; dyes such as polymethine, xanthene, coumarin, cyanine and the like; and metal complex of 8-hydroxyquinoline and its derivative, aromatic amine, tetraphenylcyclopentadiene and its derivative, and tetraphenylbutadiene and its derivative and the like.

Specific examples thereof include well-known light emitting materials such as those described in JP-A-57-51781 and JP-A-59-194393.

When the polymeric LED of the present invention has at least one hole transporting layer, the hole transporting material used is not specifically limited, and examples thereof include, (a) the hole transporting material having a carbazole ring or its derivative at the side chain such as polyvinyl carbazole and its derivative
(b) polysilane and its derivative
(c) the hole transporting material having an aromatic amine compound group at the side chain or the main chain such as polysiloxane derivative having aromatic amine in the side chain or the main chain, polyaniline and its derivative
(d) pyrazoline derivative, arylamine derivative, stilbene derivative, triphenyldiamine derivative
(e) the conjugated polymer such as polythiophene and its derivative, poly(p-phenylenevinylene) and its derivative, poly(2,5-thienylenevinylene) and its derivative and the like.

Specific examples of the hole transporting material include those described in JP-A-63-70257, JP-A-63-175860, JP-A-2-135359, JP-A-2-135361, JP-A-2-209988, JP-A-3-37992, JP-A-3-152184 and the like.

Among them, the hole transporting material used in the hole transporting layer is preferably the polymeric hole transporting material such as polyvinyl carbazole and its derivative, polysilane and its derivative, polysiloxane derivative having aromatic amine compound group in the side chain or the main chain, polyaniline and its derivative, polythiophene and its derivative, poly(p-phenylenevinylene) and its derivative, poly(2,5-thienylenevinylene) and its derivative and the like, and more preferably polyvinyl carbazole and its derivative, polysilane and its derivative, polysiloxane derivative having aromatic amine compound group in the side chain or the main chain. In the case of using the low-molecular-weight hole transporting material, it is preferably used by dispersing in a polymer binder.

Polyvinyl carbazole and its derivative can be obtained, for example, by cation polymerization or radical polymerization from vinyl monomers.

Examples of the polysilane and its derivative include compounds such as those described in Chem. Rev. Vol.89, page 1359 (1989) and GP2300196. As the synthesizing method, the method described in them can be used. Among them, a Kipping method is preferably used.

Polysiloxane and its derivative, since the siloxane skeleton structure has little hole transporting properties, those having the structure of the above low-molecular-weight hole transporting material in the side chain or the main chain is appropriately used. Examples thereof include those having aromatic amine having the hole transporting properties at the side chain or main chain.

The method of forming a film of the hole transport layer is not limited. As the low-molecular-weight hole transporting material, examples thereof include a method of forming a film from a mixed solution with a polymer binder. In the case of polymeric hole transporting material, examples include a method of forming a film from a solution.

The solvent used for a film forming from a solution is not specifically limited, as far as it dissolves the hole transporting material. Examples of the solvent include chlorine solvents such as chloroform, methylene chloride, dichloroethane and the like; ether solvents such as tetrahydrofuran and the like; aromatic hydrocarbon solvents such as toluene, xylene and the like; ketone solvents such as acetone, methyl ethyl ketone and the like; ester solvents such as ethyl acetate, butyl acetate, ethylcellsolve acetate and the like.

As a method of forming a film forming from a solution, coating methods such as spin coating method, casting method, micro gravure coating method, gravure coating method, bar coating method, roll coating method, wire bar coating method, dipping method, spray coating method, screen printing method, flexographic printing method, offset printing method or the like can be used.

As the polymeric binder to be mixed, those which do not extremely inhibit charge transport are preferable. Those whose absorption to visible light is not strong are preferably used. Examples of the polymer binder include polycarbonate, polyacrylate, polymethyl acrylate, polymethyl methacrylate, polystyrene, polyvinyl chloride, polysiloxane and the like.

In the present invention, when the polymer LED has the electron transport layer, as the electron transporting material used, well-known materials can be used. Examples thereof include oxadiazole derivative, anthraquinodimethane and its derivative, benzoquinone and its derivative, naphthoquinone and its derivative, anthraquinone and its derivative, tetracyanoanthraquinodimethane and its derivative, fluorenone derivative, diphenyldicyanoethylene and its derivative, diphenoquinone derivative, metal complex of 8-hydroxyquinoline and its derivative and the like.

Specific examples thereof include those described in JP-A-63-70257, JP-A-63-175860, JP-A-2-135359, JP-A-2-135361, JP-A-2-209988, JP-A-3-37992 and JP-A-3-152184.

Among them, oxadiazole derivative, benzoquinone and its derivative, anthraquinone and its derivative, and metal complex of 8-hydroxyquinoline and its derivative are preferable, 2-(4-biphenylyl)-5-(4-t-butylphenyl)-1,3,4-oxadiazole, benzoquinone, anthraquinone and tris(8-quinolinol)aluminum are more preferable.

The method of forming a film of the electron transport layer is not specifically limited. In case of the low-molecular-weight electron transporting material, there can be used vacuum deposition method from the powder state or method by film forming from the solution or molten state. In case of the polymeric electron transporting material, there can be used a method by film forming from the solution or molten state. In case of forming the film from the solution or molten state, the polymer binder may be used in combination.

The solvent used for film forming from the solution is not limited, as far as it can dissolve the electron transporting material and/or polymer binder. Examples of the solvent include chlorine solvents such as chloroform, methylene chloride, dichloroethane and the like; ether solvents such as tetrahydrofuran and the like; aromatic hydrocarbon solvents such as toluene, xylene and the like ketone solvents such as acetone, methyl ethyl ketone and the like; ester solvent such as ethyl acetate, butyl acetate, ethylcellsolve acetate and the like.

As a method of forming a film forming from a solution or molten state, coating methods such as spin coating method, casting method, micro gravure coating method, gravure coating method, bar coating method, roll coating method, wire bar coating method, dipping method, spray coating method, screen printing method, flexographic printing method, offset printing method or the like can be used.

As the polymer binder to be mixed, those which do not extremely inhibit charge transport are preferable. Those whose absorption to visible light is not strong are preferably used. Examples of the polymer binder include poly(N-vinylcarbazole), polyaniline and its derivative, polythiophene and its derivative, poly(p-phenylenevinylene) and its derivative, poly(2,5-thienylenevinylene) and its derivative, polycarbonate, polyacrylate, polymethyl acrylate, polymethyl methacrylate, polystyrene, polyvinyl chloride, polysiloxane and the like.

In the present invention, as the transparent or semitransparent metal of the anode, there can be used conductive material oxide films, semitransparent metal thin films and the like. Specifically, indium-tin oxide (ITO), zinc oxide (ZnO), films (e.g. NESA) made of conductive glasses such as tin oxide($SnO_2$), and the like, Au, Pt, Ag, Cu and the like are used. ITO, ZnO and $SnO_2$ are preferable. Examples of the production method include vacuum deposition method, sputtering method, ion plating method, plating method and the like. As the anode, an organic transparent conductive film such as polyaniline and its derivative, polythiophene and its derivative and the like may also be used.

AS the material using in the cathode of the present invention, it is preferable to have small work function. For example, there can be used Al, In, Mg, Ca, Li, Mg—Ag alloy, Mg—In alloy, Mg—Al alloy, In—Ag alloy, Al—Li alloy, Li—Mg alloy, Li—In alloy, Ca—Al alloy, graphite, praphite intercalation compound, and the like.

As the method of producing the cathode, there can be used vacuum deposition method, sputtering method or laminate method by heat-pressing thin metal films and the like. After producing the anode, a protecting layer for protecting the polymeric LED may also be provided.

The following Examples further illustrate the present invention in detail but are not to be construed to limit the scope thereof.

In the following Examples, a number-average molecular weight in terms of polystyrene was measured by gel permeation chromatography (GPC) using chloroform as a solvent.

EXAMPLE 1
<Synthesis of Polymeric Fluorescent Substance 1>

2,5-dioctyloxy-p-xylylene dichloride was reacted with triphenylphosphine in a N,N-dimethylformamide solvent to synthesize a phosphonium salt (1). 47.74 Parts by weight of the resulting phosphonium salt and 5.5 parts by weight of terephthalaldehyde were dissolved in an ethyl alcohol/chloroform mixed solvent. An ethyl alcohol solution containing 5.4 parts by weight of lithium ethoxide was added dropwise to an ethyl alcohol/chloroform mixed solvent of a phosphonium salt and dialdehyde, followed by polymerization. To the resulting reaction solution, a chloroform solution of 1-pyrenecarbaldehyde was added and an ethyl alcohol solution containing lithium ethoxide was further added dropwise, and then the mixed solution was polymerized with stirring at room temperature for 3 hours. After the reaction solution was allowed to stand at room temperature overnight, the formed precipitate was recovered by filtration and the precipitate was washed with ethyl alcohol. This precipitate was dissolved in chloroform and then subjected to reprecipitation purification by adding ethyl alcohol. The precipitate was dried under reduced pressure to obtain 8.0 parts by weight of a polymer. This polymer is referred to as a "polymeric fluorescent substance 1".

The repeating unit of the polymeric fluorescent substance 1 and its molar ratio estimated from a charging ratio of monomers are shown below. It was confirmed by $^1$H-NMR that the polymer has a pyrenyl group at the molecular terminal.

(10)

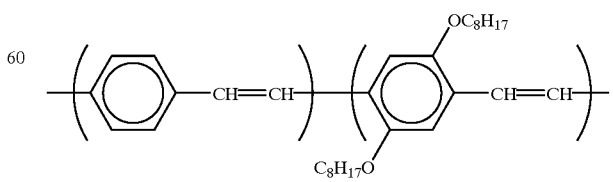

In the formula, the molar ratio of two repeating units is 50:50 and two repeating units are combined each other.

The number-average molecular weight in terms of polystyrene of the polymeric fluorescent substance 1 was $4.0 \times 10^3$. The structure of the polymeric fluorescent substance 1 was confirmed by infrared absorption spectrum and NMR.

<Synthesis of Organic Compound 1>

2,5-dioctyloxy-p-xylylene dichoride was reacted with triphenylphosphine in a N,N-dimethylformamide solvent to synthesize a phosphonium salt. 4.8 Parts by weight of the resulting phosphonium salt and 2.5 parts by weight of 1-pyrenecarbaldehyde were dissolved in an ethyl alcohol/chloroform mixed solvent. An ethyl alcohol solution containing lithium ethoxide obtained by reacting 0.15 parts by weight of lithium with ethyl alcohol was added dropwise in a mixed solution of phosphonium salt and aldehyde. After the reaction at room temperature for three hours, the resulting precipitate was recovered by filtration and the precipitate was washed in order with ethyl alcohol, ethyl alcohol/water and ethyl alcohol. The precipitate was dried under reduced pressure to obtain 3.0 parts by weight of a product. This material is referred to as a "organic compound 1". The structure of the organic compound 1 is shown below.

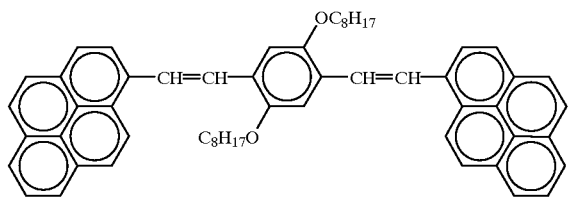

(12)

The structure of the organic compound 1 was confirmed by infrared absorption spectrum and NMR.

<Measurement of Oxidation Potential and Absorption Edge Wavelength>

A thin film was formed on a platinum electrode by dipping from a toluene solution of 1.0% by weight of the polymeric fluorescent substance 1. Cyclic voltammetry was conducted in an acetonitrile solution of 0.1N of tetrabutylammonium tetrafluoroborate using a platinum electrode coated with the polymeric fluorescent substance 1 as a work electrode, another uncoated platinum electrode as a counter electrode and a silver/silver chloride electrode as a reference electrode. The sweep rate was 50 mV/second and the sweeping was conducted within the range from −200 to 1200 mV vs. a silver/silver chloride electrode. In the resulting cyclic voltamogram, the potential at the intersection of each tangent line to the baseline and the upstanding portion of the oxidation wave was 750 mV. The oxidation potential of the organic compound 1 was determined in the same manner. As a result, it was 710 mV. Therefore, the organic compound 1 satisfied the condition 1 to the polymeric fluorescent substance 1.

Next, a thin film was formed on a quartz substrate by spin coat from a toluene solution of 1.0% by weight of the polymeric fluorescent substance 1. The absorption spectrum was measured with an absorption spectrophotometer (UV3500 type manufactured by Hitachi, Ltd.). The wavelength at the intersection of each tangent line to the baseline and upstanding portion of the absorption was determined. As a result, it was 530 nm. The absorption edge wavelength of the organic compound 1 was determined in the same manner. As a result, it was 540 nm. Therefore, the organic compound 1 satisfied the condition 2 to the polymeric fluorescent substance 1.

<Production and Evaluation of Device>

A methylene chloride solution of 1.7% by weight of poly(N-vinyl carbazole) (hereinafter referred to as PVCz) containing 23% by weight of the organic compound 1 based on PVCz was prepared. Using a methylene chloride solution of the above PVCz, a film was formed in a thickness of 50 nm by dip coat method on a glass substrate with ITO film in a thickness of 200 nm by electron beam deposition method.

Next, using a toluene solution of 1.0% by weight of the polymeric fluorescent substance 1, a film was formed in a thickness of 40 nm by spin coat method. Then, after the film was dried at 120° C. under reduced pressure for one hour, tris(8-quinokinol)aluminum (hereinafter referred to as an $Alq_3$) was deposited in a thickness of 40 nm at a rate of 0.1 to 0.2 nm/second as an electron transporting layer. Finally, an aluminum-lithium alloy (Al:Li=about 200:1 in weight ratio) was deposited thereon in a thickness of 100 nm as a cathode to produce a polymeric LED. The vacuum degree during the deposition was always $1 \times 10^{-5}$ Torr or less.

The constant current driving of this device was continuously conducted in a nitrogen flow at a constant current density of 25 mA/cm$^2$. The luminance after aging for five hours was 716 cd/m$^2$, and the half-lifetime of the luminance was about 350 hours. The increasing rate of the driving voltage during driving after aging for five hour was 0.01V/hr.

Comparative Example 1

According to the same manner as that described in Example 1 except for not adding organic compound 1 to the methylene chloride solution of PVCz, polymer LED was produced.

The constant current driving of this device was continuously conducted in a nitrogen flow at a constant current density of 25 mA/cm$^2$. The luminance after aging for five hours was 1173 cd/m$^2$, and the half-lifetime of the luminance was about 43 hours. The increasing rate of the driving voltage during driving after aging for five hour was 0.120V/hr.

EXAMPLE 2

According to the same manner as that described in Example 1 except for containing 4.8% by weight of organic compound 1 in the methylene chloride solution of PVCz, polymer LED was produced.

The constant current driving of this device was continuously conducted in a nitrogen flow at a constant current density of 25 mA/cm$^2$. The luminance after aging for five hours was 1395 cd/m$^2$, and the half-lifetime of the luminance was about 102 hours. The increasing rate of the driving voltage during driving after aging for five hour was 0.067V/hr.

EXAMPLE 3

According to the same manner as that described in Example 1 except for containing 9.1% by weight of organic compound 1 in the methylene chloride solution of PVCz, polymer LED was produced.

The constant current driving of this device was continuously conducted in a nitrogen flow at a constant current density of 25 mA/cm$^2$. The luminance after aging for five hours was 1145 cd/m$^2$, and the half-lifetime of the luminance was about 149 hours. The increasing rate of the driving voltage during driving after aging for five hour was 0.045V/hr.

EXAMPLE 4

<Synthesis of Polymeric Fluorescent Substance 2>

The phosphonium salt(1) of 2,5-dioctyloxy-p-xylylene dichloride synthesized in Example 1 was mixed with the same mole of the phosphonium salt(2) of 2-methoxy-5-octyloxy-p-xylylene dichoride snthesized in the same manner as that described in Example 1. 60 Parts by weight of the mixed phosphonium salt and 7.2 parts by weight of terephthalaldehyde were dissolved in an ethyl alcohol/chloroform mixed solvent. An ethyl alcohol solution containing 7.0 parts by weight of lithium ethoxide was added dropwise to an ethyl alcohol/chloroform mixed solvent of a phosphonium salts and dialdehyde, followed by polymerization. To the resulting reaction solution, a chloroform solution of 1-pyrenecarbaldehyde was added and an ethyl alcohol solution containing lithium ethoxide was further added dropwise, and then the mixed solution was polymerized with stirring at room temperature for 3 hours. After the reaction solution was allowed to stand at room temperature overnight, the formed precipitate was recovered by filtration and the precipitate was washed with ethyl alcohol. This precipitate was dissolved in chloroform and then subjected to reprecipitation purification by adding ethyl alcohol. The precipitate was dried under reduced pressure to obtain 8.0 parts by weight of a polymer. This polymer is referred to as a "polymeric fluorescent substance 2".

The repeating unit of the polymeric fluorescent substance 2 estimated from a charging ratio of monomers are shown formula (12) and (13) below. Molar ratio of these two repeating units is about 1:1. The number-average molecular weight in terms of polystyrene of the polymeric fluorescent substance 2 was $3.4 \times 10^3$. It was confirmed by $^1$H-NMR that the polymer has a pyrenyl group at the molecular terminal.

<Synthesis of Organic Compound 2>

4.8 parts by weight of the phosphonium salt(1) and 4.3 parts by weight of the phosphonium salt(2), obtained by the same manner as the synthesis of polymeric fluorescent substance 2, and 4.3 parts by weight of terephtalaldehyde and 1.2 parts by weight of 1-pyrenecarbaldehyde were all dissolved in an ethyl alcohol/chloroform mixed solvent. An ethyl alcohol solution containing lithium ethoxide obtained by reacting 0.28 parts by weight of lithium with ethyl alcohol was added dropwise in a mixed solution of phosphonium salts and aldehydes, and then the mixed solution was reacted with stirring at room temperature for three hour. After the reaction solution was allowed to stand at room temperature overnight, the formed precipitate was recovered by filtration and the precipitate was washed with ethyl alcohol. This precipitate was dissolved in chloroform and then subjected to reprecipitation purification by adding ethyl alcohol. Furthermore the precipitate was dissolved in toluene and then subjected to reprecipitation purification by adding ethyl alcohol. The precipitate was dried under reduced pressure to obtain 0.9 parts by weight of a product. This material is referred to as a "organic compound 2".

The structure of the organic compound 2 estimated from a charging ratio of monomers, and repeating units constituting the organic compound 2 is the same as those of polymeric fluorescent substance 2. It was confirmed by $^1$H-NMR that the material has a pyrenyl group at the molecular terminal. Average number of total amount of structures represented by formula (12) and (13) containing in one molecule of organic compound 2 was 4. The number was estimated from the ratio of the proton signal of —OCH$_2$— group and —OCH$_3$ group in substituent of phenylene group at around 3.5~4 ppm of $^1$H-NMR and the proton signal of pyrenyl group at around 8~8.5 ppm of $^1$H-NMR.

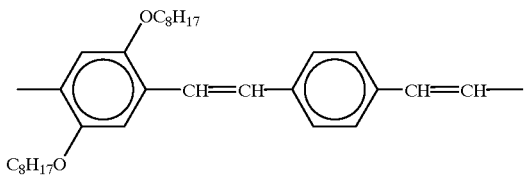

(12)

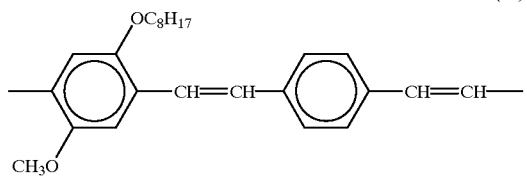

(13)

In the formulas, the molar ratio of two repeating units is 50:50 on the average and two repeating units are combined randomly.

<Measurement of Oxidation Potential and Absorption Edge Wavelength>

The oxidation potentials of polymeric fluorescent substance 2 and organic compound 2 was determined in the same manner as Example 1. As a result, they were 873 mV and 853 mV respectively. Therefore, the organic compound 2 satisfied the condition 1 to the polymeric fluorescent substance 2.

Next, absorption edge wavelengths of polymeric fluorescent substance 2 and organic compound 2 was determined in the same manner as Example 1. As a result, they were 525 nm and 530 nm respectively. Therefore, the organic compound 2 satisfied the condition 2 to the polymeric fluorescent substance 2.

<Production and Evaluation of Device>

According to the same manner as that described in Example 1 except for using polymeric fluorescent substance 2 and containing 30% by weight of organic compound 2 in the methylene chloride solution of PVCz, polymer LED was produced.

The constant current driving of this device was continuously conducted in a nitrogen flow at a constant current density of 25 mA/cm$^2$. The luminance after aging for five hours was 518 cd/m$^2$, and the half-lifetime of the luminance was about 120 hours. The increasing rate of the driving voltage during driving after aging for five hour was 0.027V/hr.

EXAMPLE 5

<Synthesis of Organic Compound 3>

2,5-dioctyloxy-p-xylylene dichoride was reacted with triphenylphosphine in a N,N-dimethylformamide solvent to synthesize a phosphonium salt. 9.55 g of the resulting phosphonium salt, 0.80 g of isophtalaldehyde and 1.84 g of 1-pyrenecarbaldehyde were dissolved in an ethyl alcohol/toluene mixed solvent. 12.7 ml methyl alcohol solution containing 12% lithium methoxide was dissolved in 50 ml ethyl alcohol and the solution was added dropwise in a mixed solution of phosphonium salt and aldehydes. After the reaction with stirring at room temperature for four hours, the solution was allowed to stand at room temperature overnight. The formed precipitate was recovered by filtration and the precipitate was washed in order with ethyl alcohol, ethyl alcohol/water and ethyl alcohol. This precipitate was dissolved in toluene and then subjected to reprecipitation purification by adding ethyl alcohol. The precipitate was dried under reduced pressure to obtain 2.7 g of a product. This material is referred to as a "organic compound 3". The structure of the organic compound 3 is shown below.

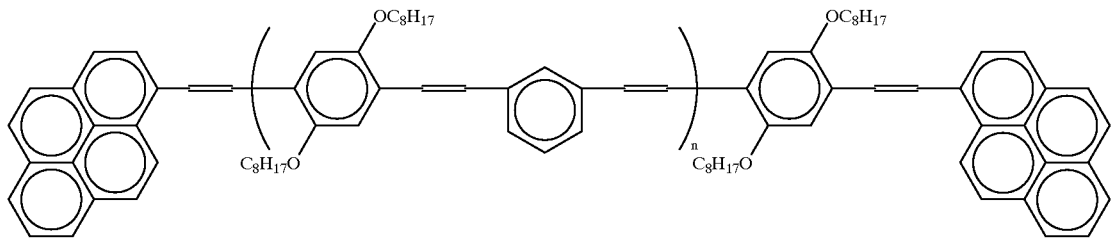

(14)

In the above formula, n was 2.0 on the average.

<Measurement of Oxidation Potential and Absorption Edge Wavelength>

The oxidation potentials of organic compound 3 was determined in the same manner as Example 1. As a result, it was 863 mV. Therefore, the organic compound 3 satisfied the condition 1 to the polymeric fluorescent substance 2.

Next, absorption edge wavelengths of organic compound 3 was determined in the same manner as Example 1. As a result, it was 500 nm. Therefore, the organic compound 3 satisfied the condition 2 to the polymeric fluorescent substance 2.

<Production and Evaluation of Device>

According to the same manner as that described in Example 4 except for containing 5% by weight of organic compound 3 in the methylene chloride solution of PVCz and using 2.0% by weight decalin solution of polymeric fluorescent substance 2, polymer LED was produced.

The constant current driving of this device was continuously conducted in a nitrogen flow at a constant current density of 25 mA/cm$^2$. The luminance after aging for ten hours was 512 cd/m$^2$, and the half-lifetime of the luminance was about 138 hours. The increasing rate of the driving voltage during driving after aging for 10 hour was 0.025V/hr.

EXAMPLE 6

<Production and Evaluation of Device>

According to the same manner as that described in Example 5 except for containing 10% by weight of organic compound 3 in the methylene chloride solution of PVCz, polymer LED was produced.

The constant current driving of this device was continuously conducted in a nitrogen flow at a constant current density of 25 mA/cm$^2$. The luminance after aging for ten hours was 478 cd/m$^2$, and the half-lifetime of the luminance was about 115 hours. The increasing rate of the driving voltage during driving after aging for 10 hour was 0.023V/hr.

EXAMPLE 7

<Production and Evaluation of Device>

According to the same manner as that described in Example 5 except for containing 20% by weight of organic compound 3 in the methylene chloride solution of PVCz, polymer LED was produced.

The constant current driving of this device was continuously conducted in a nitrogen flow at a constant current density of 25 mA/cm$^2$. The luminance after aging for ten hours was 401 cd/m$^2$, and the half-lifetime of the luminance was about 163 hours. The increasing rate of the driving voltage during driving after aging for 10 hour was 0.020V/hr.

EXAMPLE 8

<Production and Evaluation of Device>

According to the same manner as that described in Example 5 except for containing 30% by weight of organic compound 3 in the methylene chloride solution of PVCz, polymer LED was produced.

The constant current driving of this device was continuously conducted in a nitrogen flow at a constant current density of 25 mA/cm$^2$. The luminance after aging for ten hours was 525 cd/m$^2$, and the half-lifetime of the luminance was about 243 hours. The increasing rate of the driving voltage during driving after aging for 10 hour was 0.011V/hr.

EXAMPLE 9

<Production and Evaluation of Device>

According to the same manner as that described in Example 5 except for containing 50% by weight of organic compound 3 in the methylene chloride solution of PVCz, polymer LED was produced.

The constant current driving of this device was continuously conducted in a nitrogen flow at a constant current density of 25 mA/cm$^2$. The luminance after aging for ten hours was 348 cd/m$^2$, and the half-lifetime of the a luminance was about 189 hours. The increasing rate of the driving voltage during driving after aging for 10 hour was 0.009V/hr.

EXAMPLE 10

<Synthesis of Organic Compound 4>

2,5-dioctyloxy-p-xylylene dichoride was reacted with triphenylphosphine in a N,N-dimethylformamide solvent to synthesize a phosphonium salt. 9.55 g of the resulting phosphonium salt, 0.80 g of terephtalaldehyde and 1.84 g of 1-pyrenecarbaldehyde were dissolved in an ethyl alcohol/toluene mixed solvent. 12 ml methyl alcohol solution containing 12% lithium methoxide was dissolved in 40 ml ethyl alcohol and the solution was added dropwise in a mixed solution of phosphonium salt and aldehydes. After the reaction with stirring at room temperature for four hours, the solution was allowed to stand at room temperature overnight. The formed precipitate was recovered by filtration and the precipitate was washed in order with ethyl alcohol, ethyl alcohol/water and ethyl alcohol. This precipitate was dissolved in toluene and then subjected to reprecipitation purification by adding ethyl alcohol. The precipitate was dried under reduced pressure to obtain 1.6 g of a product. This material is referred to as a "organic compound 4". The structure of the organic compound 4 is shown below.

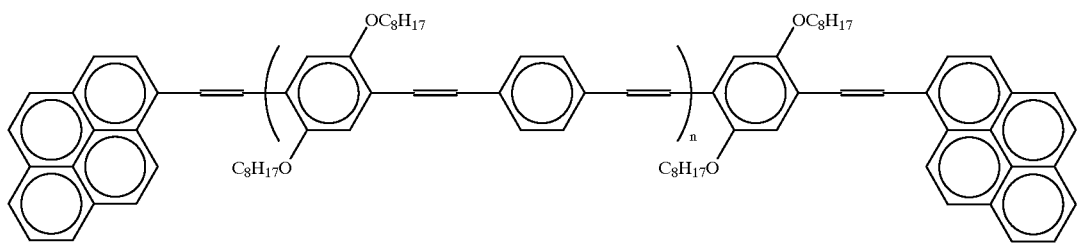

(15)

In the above formula, n was 2.4 on the average.

<Measurement of Oxidation Potential and Absorption Edge Wavelength>

The oxidation potentials of organic compound 4 was determined in the same manner as Example 1. As a result, it was 783 mV. Therefore, the organic compound 4 satisfied the condition 1 to the polymeric fluorescent substance 2.

Next, absorption edge wavelengths of organic compound 4 was determined in the same manner as Example 1. As a result, it was 535 nm. Therefore, the organic compound 4 satisfied the condition 2 to the polymeric fluorescent substance 2.

<Production and Evaluation of Device>

According to the same manner as that described in Example 4 except for containing 20% by weight of organic compound 4 in the methylene chloride solution of PVCz and using 2.0% by weight decalin solution of polymeric fluorescent substance 2, polymer LED was produced.

The constant current driving of this device was continuously conducted in a nitrogen flow at a constant current density of 25 mA/cm$^2$. The luminance after aging for five hours was 1035 cd/m$^2$, and the half-lifetime of the luminance was about 157 hours. The increasing rate of the driving voltage during driving after aging for five hour was 0.038V/hr.

EXAMPLE 11

<Synthesis of Organic Compound 5>

2,5-bis(3-phenylpropyloxy)-p-xylylene dichoride was reacted with triphenylphosphine in a N,N-dimethylformamide solvent to synthesize a phosphonium salt. 10.56 g of the resulting phosphonium salt, 0.67 g of terephtalaldehyde and 2.3 g of 1-pyrenecarbaldehyde were dissolved in an ethyl alcohol/toluene mixed solvent. 12 ml methyl alcohol solution containing 12% lithium methoxide was dissolved in 40 ml ethyl alcohol and the solution was added dropwise in a mixed solution of phosphonium salt and aldehydes. After the reaction with stirring at room temperature for four hours, the solution was allowed to stand at room temperature overnight. The formed precipitate was recovered by filtration and the precipitate was washed in order with ethyl alcohol, ethyl alcohol/water and ethyl alcohol. This precipitate was dissolved in toluene and then subjected to reprecipitation purification by adding ethyl alcohol. The precipitate was dried under reduced pressure to obtain 3.3 g of a product. This material is referred to as a "organic compound 5". The structure of the organic compound 5 is shown below.

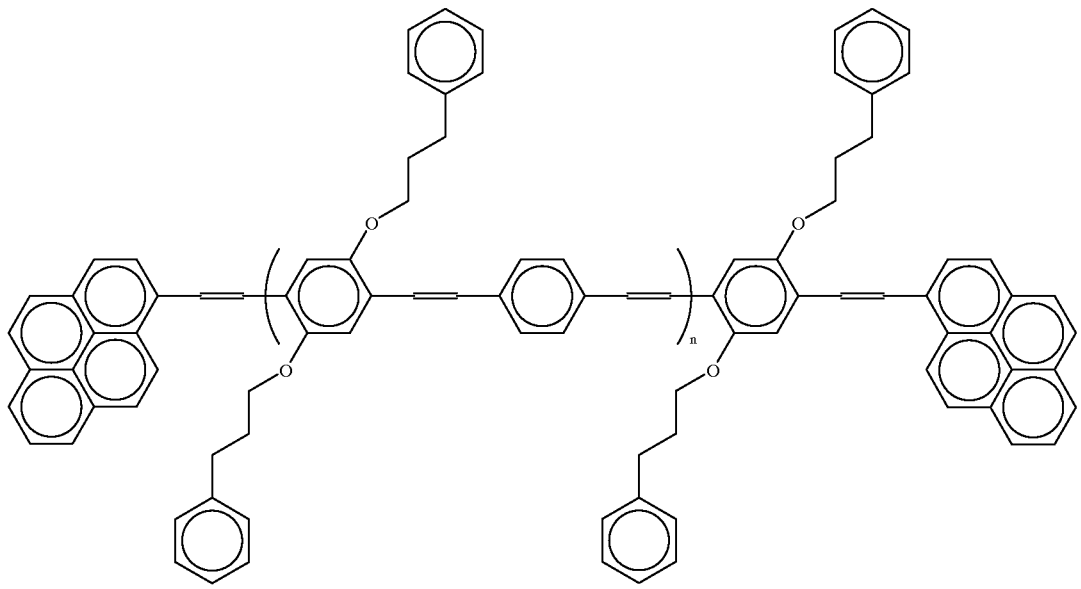

(16)

In the above formula, n was 1.6 on the average.

<Measurement of Oxidation Potential and Absorption Edge Wavelength>

The oxidation potentials of organic compound 5 was determined in the same manner as Example 1. As a result, it was 780 mV. Therefore, the organic compound 5 satisfied the condition 1 to the polymeric fluorescent substance 2.

Next, absorption edge wavelengths of organic compound 5 was determined in the same manner as Example 1. As a result, it was 525 nm. Therefore, the organic compound 5 satisfied the condition 2 to the polymeric fluorescent substance 2.

<Production and Evaluation of Device>

According to the same manner as that described in Example 10 except for using organic compound 5 instead of organic compound 4, polymer LED was produced.

The constant current driving of this device was continuously conducted in a nitrogen flow at a constant current density of 25 mA/cm$^2$. The luminance after aging for thirty hours was 495 cd/m$^2$, and the half-lifetime of the luminance was about 148 hours. The increasing rate of the driving voltage during driving after aging for thirty hour was 0.017V/hr.

EXAMPLE 12

<Synthesis of Organic Compound 6>

2,5-dioctyloxy-p-xylylene dichoride was reacted with triphenylphosphine in a N,N-dimethylformamide solvent to synthesize a phosphonium salt. 9.55 g of the resulting phosphonium salt, 0.54 g of terephtalaldehyde and 2.76 g of 1-pyrenecarbaldehyde were dissolved in an ethyl alcohol/toluene mixed solvent. 12 ml methyl alcohol solution containing 12% lithium methoxide was dissolved in 40 ml ethyl alcohol and the solution was added dropwise in a mixed solution of phosphonium salt and aldehydes. After the reaction with stirring at room temperature for four hours, the solution was allowed to stand at room temperature overnight. The formed precipitate was recovered by filtration and the precipitate was washed in order with ethyl alcohol, ethyl alcohol/water and ethyl alcohol. This precipitate was dissolved in toluene and then subjected to reprecipitation purification by adding ethyl alcohol. The precipitate was dried under reduced pressure to obtain 1.1 g of a product. This material is referred to as a "organic compound 6". The structure of the organic compound 6 is shown below.

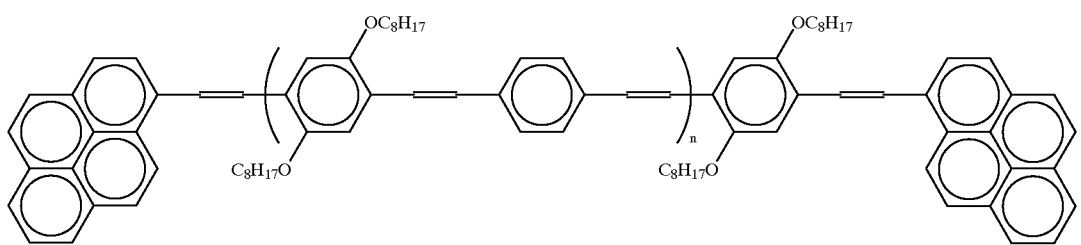

(17)

In the above formula, n was 1.2 on the average.

<Measurement of Oxidation Potential and Absorption Edge Wavelength>

The oxidation potentials of organic compound 6 was determined in the same manner as Example 1. As a result, it was 738 mV. Therefore, the organic compound 6 satisfied the condition 1 to the polymeric fluorescent substance 2.

Next, absorption edge wavelengths of organic compound 6 was determined in the same manner as Example 1. As a result, it was 535 nm. Therefore, the organic compound 6 satisfied the condition 2 to the polymeric fluorescent substance 2.

<Production and Evaluation of Device>

According to the same manner as that described in Example 10 except for using organic compound 6 instead of organic compound 4, polymer LED was produced.

The constant current driving of this device was continuously conducted in a nitrogen flow at a constant current density of 25 mA/cm$^2$. The luminance after aging for thirty hours was 550 cd/m$^2$, and the half-lifetime of the luminance was about 130 hours. The increasing rate of the driving voltage during driving after aging for thirty hour was 0.025V/hr.

A long-lifetime polymer light emitting device, wherein an attenuation in luminance and an increase in driving voltage are very small, can be obtained by adding a specific organic compound into an charge transporting layer of the polymer light emitting device. Therefore, the polymer light emitting device can be preferably used in a device such as a curved surface-shape or flat light source as a back light, flat panel display and the like.

What is claimed is:

1. A polymer light emitting device at least having a light emitting layer containing a polymeric fluorescent substance and a charge transporting layer provided adjacent to the light emitting layer between electrodes consisting of a pair of an anode and a cathode, at least one of which electrode is transparent or semitransparent, wherein said polymeric fluorescent substance contains one or more kind of repeating units represented by the following formula (1), the sum of the repeating units being not less than 50% by mol based on the total repeating units, and has a number-average molecular weight of 10$^3$ to 10$^7$ in terms of polystyrene $$—Ar_1—CR_1=CR_2— \quad (1)$$

(wherein Ar$_1$ represents an arylene group having 4 to 20 carbon atoms taking part in a conjugated bond, or a heterocyclic compound group having 4 to 20 carbon atoms taking part in a conjugated bond; and R$_1$ and R$_2$ independently represent a group selected from the group consisting of hydrogen, an alkyl group having 1 to 20 carbon atoms, an aryl group having 6 to 20 carbon atoms, a heterocyclic compound group having 4 to 20 carbon atoms and a cyano group), and said charge transporting layer contains an organic compound satisfying the following conditions 1 and 2 in an amount of from 1 to 70% by weight, and said organic compound satisfying the above conditions 1 and 2 has two or more condensed polycyclic aromatic compound groups containing three or more rings, in a molecule $$E_{OX2}-0.15 \leq E_{OX1} \leq E_{OX2}+0.10 \quad \text{(condition 1)}$$

$$\lambda_{edge2}-30 \leq \lambda_{edge1} \leq \lambda_{edge2}+20 \quad \text{(condition 2)}$$

wherein $E_{OX1}$ and $\lambda_{edge1}$ respectively represent an electrochemically determined oxidation potential and an absorption edge wavelength of an absorption spectrum of said organic compound; $E_{OX2}$ and $\lambda_{edge2}$ respectively represent an electrochemically determined oxidation potential and an absorption edge wavelength of an absorption spectrum of said polymeric fluorescent substances used in said light emitting layer; and the unit in the condition 1 is V and the unit in the condition 2 is nm).

2. A polymer light emitting device at least having a light emitting layer containing a polymeric flourescent substance and a charge transporting layer provided adjacent to the light emitting layer between electrodes consisting of a pair of an anode and a cathode, at least one of which electrodes is transparent or semitransparent, wherein said polymeric flourescent substance contains one or more kinds of repeating units represented by the following formula (1), the sum of the repeating units being not less than 50% by mol based on the total repeating units, and has a number-average molecular weight of $10^3$ to $10^7$ in terms of polystyrene $$-Ar_1-CR_1=CR_2- \qquad (1)$$

(wherein $Ar_1$ represents an arylene group having 4 to 20 carbon atoms taking part in a conjugated bond, or a heterocyclic compound group having 4 to 20 carbon atoms taking part in a conjugated bond; and $R_1$ and $R_2$ independently represent a group selected from the group consisting of hydrogen, an alkyl group having 1 to 20 carbon atoms, an aryl group having 6 to 20 carbon atoms, a heterocyclic compound group having 4 to 20 carbon atoms and a cyano group), and said charge transporting layer contains an organic compound satisfying the following conditions 1 and 2 in an amount of from 1 to 70% by weight, said organic compound has one or more kinds of repeating units of the polymeric fluorescent substance used in the light emitting layer as a part of structural units of the organic compound $$E_{OX2}-0.15 \leq E_{OX1} \leq E_{OX2}+0.10 \qquad \text{(condition 1)}$$

$$\lambda_{edge2}-30 \leq \lambda_{edge1} \leq \lambda_{edge2}+20 \qquad \text{(condition 2)}$$

(wherein $E_{OX1}$ and $\lambda_{edge1}$ respectively represent an electrochemically determined oxidation potential and an absorption edge wavelength of an absorption spectrum of said organic compound; $E_{OX2}$ and $\lambda_{edge2}$ respectively represent an electrochemically determined oxidation potential and an absorption edge wavelength of an absorption spectrum of said polymeric fluorescent substance used in said light emitting layer; and the unit in the condition 1 is V and the unit in the condition 2 is nm).

3. The polymer light emitting device according to claim 2, wherein the organic compound satisfying the above conditions 1 and 2 is an oligomer containing 3 to 7 repeating units represented by the above formula (1) on the average.

4. The polymer light emitting device of any one of claim 1, 3 or 2, wherein the light emitting layer is produced by coating of a solution and at least one charge transporting layer is produced by coating a mixed solution of at least one organic compound satisfying the above conditions 1 and 2 and at least one charge transporting material.

5. The polymer light emitting device according to claim 1, 3 or 2, wherein at least one hole transporting layer is comprised as the charge transporting layer, and an organic compound satisfying the above conditions 1 and 2 is contained in the hole transporting layer.

6. The polymer light emitting device according to claim 5, wherein the hole transporting layer contains at least one polymeric hole transporting material having an aromatic amine compound group at the side chain or the main chain, or at least one polymeric hole transporting material having a carbazole ring or its derivative at the side chain.

7. The polymer light emitting device according to claim 5, wherein the hole transporting layer contains at least one polymeric hole transporting material having polysilane or polysiloxane as a skeleton.

* * * * *